| United States Patent [19] | [11] 4,409,561 |
|---|---|
| Shacter | [45] Oct. 11, 1983 |

[54] OPERATIONAL AMPLIFIER OUTPUT STAGE DRIVEN BY A SINGLE ENDED GAIN STAGE

[75] Inventor: Stuart B. Shacter, Mesa, Ariz.

[73] Assignee: Motorali, Inc., Schaumburg, Ill.

[21] Appl. No.: 253,980

[22] Filed: Apr. 13, 1981

[51] Int. Cl.³ .............................. H03F 3/16; H03F 3/26
[52] U.S. Cl. ....................................... 330/300; 330/262
[58] Field of Search ............... 330/254, 262, 273, 274, 330/300; 307/262, 475

[56] References Cited

U.S. PATENT DOCUMENTS 4,336,504 6/1982 Seki et al. ............................ 330/274

Primary Examiner—James B. Mullins
Assistant Examiner—Gene Wan
Attorney, Agent, or Firm—Vincent B. Ingrassia

[57] ABSTRACT

In an operational amplifier, the output of the differential first stage is applied directly to the base electrode of a voltage gain transistor which in turn drives the remainder of the operational amplifier output stage. A pair of junction field-effect-transistors in conjunction with a diode and a current mirror circuit are employed to set the quiescent voltage at the circuit output. Both pull-up and pull-down transistors are employed to achieve the correct output in response to an input at the base of the voltage gain transistor.

5 Claims, 1 Drawing Figure

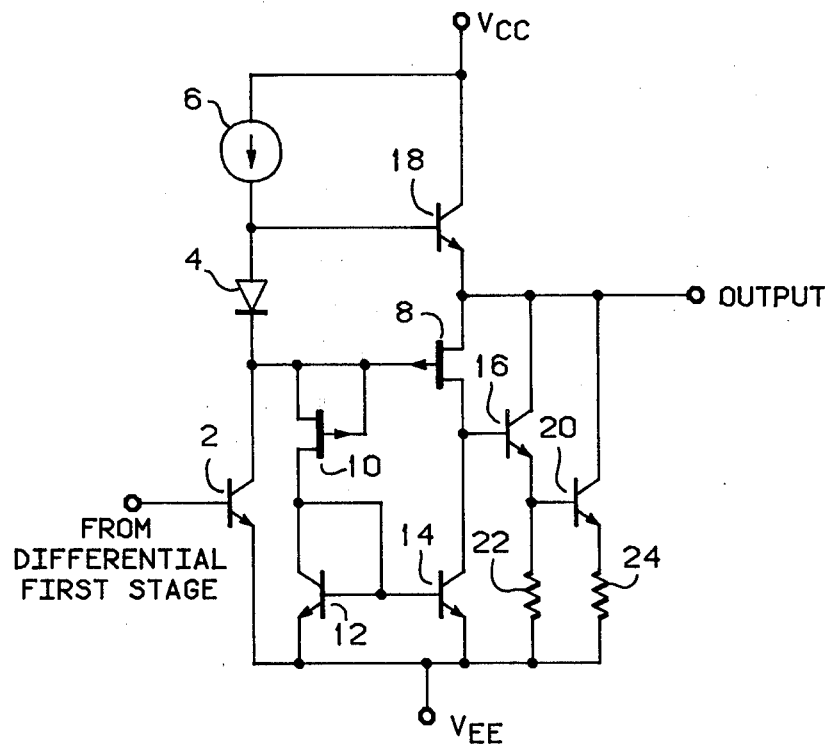

OPERATIONAL AMPLIFIER OUTPUT STAGE DRIVEN BY A SINGLE ENDED GAIN STAGE

BACKGROUND OF THE INVENTION

1. Field of the Invention

This invention relates generally to operational amplifiers and, more particularly, to an operational amplifier output stage which is driven by a single ended gain stage.

2. Description of the Prior Art

Known operational amplifiers which include junction field-effect-transistors (JFET) in the output stage such as the MLF155 manufactured by Motorola Semiconductors comprise a differential first or input stage, a second differential NPN gain stage having an output which is taken from an NPN follower, and an output stage which is driven by the NPN follower. In the semiconductor industry, efforts are constantly being made to produce smaller, less complex circuits in order to produce simple and less expensive integrated circuit chips. In the case of operational amplifiers, the reduction in circuit complexity also results in the elimination of certain parasitic effects which degrade high frequency performance.

SUMMARY OF THE INVENTION

It is an object of the present invention to provide an improved operational amplifier of the type which includes JFETs in the output stage.

It is a further object of the present invention to provide an operational amplifier output stage which included a single ended gain stage.

It is a still further object of the present invention to provide an improved operational amplifier of reduced circuit complexity by replacing a differential second stage by a single ended gain stage.

Finally, it is an object of the present invention to provide an output circuit for use in an operational amplifier which may be driven directly from the output of a single ended gain stage.

According to an aspect of the invention there is provided an operational amplifier of the type which includes a differential first stage, an output circuit having an input and an output, comprising: a voltage gain transistor having a base electrode coupled to the output of said differential first stage, an emitter adapted to be coupled to a first source of supply voltage, and having a collector; a current source coupled to the collector of said voltage gain transistor and adapted to be coupled to a second source of supply voltage; first means coupled to said collector of said voltage gain transistor and to said output and responsive to current flowing from said current source for establishing a quiescent voltage at said output; voltage pull-up means coupled between said current source and said output for producing a first output voltage at said output when a first input voltage appears on said base electrode of said voltage gain transistor; and voltage pull-down means coupled to said output and to said first means for producing a second output voltage at said output when a second input voltage is applied to the base electrode of said voltage gain transistor.

BRIEF DESCRIPTION OF THE DRAWINGS

The above and other objects, features and advantages of the present invention will be more clearly understood from the following detailed description taken in conjunction with the accompanying drawings in which the sole FIGURE is a schematic diagram of the inventive operational amplifier output stage driven by a single ended gain stage.

DESCRIPTION OF THE PREFERRED EMBODIMENT

Referring to the drawing, transistor 2 is a voltage gain transistor having a base electrode which is adapted to be coupled to the output of the differential first (input) stage of an operational amplifier. The emitter of NPN transistor 2 is coupled to $V_{EE}$, and the collector of transistor 2 is coupled, via diode 4 and current source 6 to a second source of supply voltage $V_{CC}$. Current source 6 may be nothing more than a single transistor current source, and diode 4 may comprise a single transistor having its base electrode coupled to its collector electrode. Current sources $V_{CC}$ and $V_{EE}$ may for example be plus and minus 15 volts respectively.

The collector of transistor 2 is coupled to the gate electrode of a first junction field-effect-transistor 8 and to the source and gate electrodes of a second junction field-effect-transistor 10. The drains of junction field-effect-transistors 8 and 10 are coupled to a current mirror circuit which comprises NPN transistors 12 and 14 each of which have an emitter coupled to $V_{CC}$. The collector of transistor 12 is coupled to the drain electrode of field-effect-transistor 10 and the collector of transistor 14 is coupled to the drain electrode of field-effect-transistor 8 and to the base electrode of NPN transistor 16. The base electrodes of transistors 12 and 14 are coupled together and to the collector of transistor 12.

The source electrode of field-effect-transistor 8 is coupled to the output of the circuit and to the emitter terminal of NPN transistor 18 which has a collector coupled to $V_{CC}$ and a base coupled to the anode of diode 4. Transistor 16 has a collector coupled to the circuit output and has an emitter coupled to the base of transistor 20 and to $V_{EE}$ via resistor 22. Transistor 20 has a collector coupled to the circuit output and an emitter coupled to $V_{EE}$ via resistor 24. Resistor 22 merely serves to bias transistor 20 while resistor 24 acts to degenerate transistor 20 so as to reduce its voltage gain.

With the gate electrode of field-effect-transistor 10 coupled to its source electrode, its gate-to-source voltage ($V_{GS}$) is maintained at 0 volts. Field-effect-transistor 8 is matched to field-effect-transistor 10 in such a manner so that the current which flows through field-effect-transistor 8 through the action of the current mirror circuit will cause the gate-to-source voltage of transistor 8 to also be 0 volts. That is, if field-effect-transistors 8 and 10 are perfectly matched and the current mirror circuit comprising transistors 12 and 14 is perfect, the gate-to-source voltage of transistor 8 will be 0 volts. In this manner, a well controlled output can be achieved. As long as the gate-to-source voltage of field-effect transistor 8 is maintained at 0 volts, then the base-to-emitter voltage of the transistor which makes up diode 4 can be ratioed to the $V_{BE}$ of pullup transistor 18 to achieve the well controlled output.

If for example, the voltage at the base of transistor 2 were high, transistor 2 would turn on causing the voltage at its collector and therefore at the gate of field effect transistor 8 to go low. Transistor 8 will then tend to pull more current than is being supplied by transistor 18. Field-effect-transistor 8 then drives transistor 16 which in turn drives pulldown transistor 20 causing the output of the circuit to go low.

If, on the other hand, the voltage at the base of transistor 2 were to go low, additional current does not flow through field-effect-transistor 8, and pulldown transistors 16 and 20 are maintained in an "off" condition. However, the increased base drive to transistor 18 will result in it conducting more current than is being sunk by the combination of transistors 8, 16 and 20 and therefore the output terminal will rise in voltage.

In the prior art, current source 6 appears in the place of voltage gain transistor 2, and a transistor follower has an emitter coupled to the base of transistor 18, a collector coupled to $V_{CC}$ and a base coupled to the output of the differential second stage. By making the modifications shown in the drawing, the differential second stage may be eliminated.

The above description is given by way of example only. Changes in form and details may be made by one skilled in the art without departing from the scope of the invention.

I claim:

1. In an operational amplifier of the type which includes a differential first state, an output circuit having an intput and an output, comprising:
   a voltage gain transistor having a base electrode coupled to the output of said differential first stage, an emitter adapted to be coupled to a first source of supply voltage, and having a collector;
   a current source coupled to the collector of said voltage gain transistor and adapted to be coupled to a second source of supply voltage;
   first means coupled to said collector of said voltage gain transistor and to said output and responsive to current flowing from said current source for establishing a quiescent voltage at said output, said first means including:
   diode means coupled between said current source and the collector of said voltage gain transistor;
   a first junction field effect transistor having gate and source electrodes coupled to the collector of said voltage gain transistor and having a drain electrode;
   a second junction field effect transistor having a gate electrode coupled to the collector of said voltage gain transistor, a source electrode coupled to said output and a drain electrode; and
   current mirror means coupled between the drain electrode of said first junction field effect transistor and a drain electrode of said second junction field effect transistor;
   voltage pull-up means coupled between said current source and said output for producing a first output voltage at said output when a first input voltage appears on said base electrode of said voltage gain transistor; and
   voltage pull-down means coupled to said output and to said first means for producing a second output voltage at said output when a second input voltage is applied to the base electrode of said voltage gain transistor.

2. An output circuit according to claim 1 wherein said voltage pull-up means comprises first transistor having a base coupled between said current source and the anode of said diode means, an emitter coupled to said output and a collector adapted to be coupled to said second source of supply voltage.

3. An output circuit according to claim 2 wherein said voltage pull-down means comprises:
   a second transistor having a base coupled to the drain of said second junction field-effect-transistor, a collector coupled to said output and an emitter adapted to be coupled to said first source of supply voltage; and
   a third transistor having a base coupled to the emitter of said second transistor, a collector coupled to said output and an emitter adapted to be coupled to said first source of supply voltage.

4. An output circuit according to claim 3 further including impedance means coupled between the base and emitter electrodes of said third transistor.

5. An output circuit according to claim 4 wherein said first, second and third transistors are NPN transistors.

* * * * *